United States Patent
Setz et al.

(10) Patent No.: US 9,293,733 B2
(45) Date of Patent: Mar. 22, 2016

(54) ORGANIC LIGHT-EMITTING COMPONENT HAVING A LAYER WITH A LOW ABSORPTION COEFFICIENT

(71) Applicant: OSRAM Opto Semiconductors GmbH, Regensburg (DE)

(72) Inventors: Daniel Steffen Setz, Böblingen (DE); Thilo Reusch, Regensburg (DE); Thomas Dobbertin, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 13/261,887

(22) PCT Filed: Nov. 9, 2012

(86) PCT No.: PCT/EP2012/072233
§ 371 (c)(1),
(2) Date: May 14, 2014

(87) PCT Pub. No.: WO2013/072250
PCT Pub. Date: May 23, 2013

(65) Prior Publication Data
US 2015/0076452 A1   Mar. 19, 2015

(30) Foreign Application Priority Data
Nov. 14, 2011   (DE) .................... 10 2011 086 255

(51) Int. Cl.
*H01L 51/52* (2006.01)
*H01L 51/56* (2006.01)
*H01L 51/50* (2006.01)

(52) U.S. Cl.
CPC ............ *H01L 51/5268* (2013.01); *H01L 51/52* (2013.01); *H01L 51/5203* (2013.01);
(Continued)

(58) Field of Classification Search
CPC ............ H01L 51/5268; H01L 51/5271; H01L 51/5221; H01L 2251/5353; H01L 51/5206; H01L 51/5262; H01L 51/5234; H01L 51/5215; H01L 51/5218; H01L 2251/305; H01L 27/3244; H01L 33/60; H01L 51/52; H01L 51/56
USPC .......................................... 313/506
See application file for complete search history.

(56) References Cited

U.S. PATENT DOCUMENTS 6,936,961 B2   8/2005 Liao et al.
7,911,133 B2 *  3/2011 Tyan et al. .................... 313/506
(Continued)

FOREIGN PATENT DOCUMENTS

| CN | 1610466 A | 4/2005 |
|---|---|---|
| CN | 101189745 A | 5/2008 |

(Continued)

OTHER PUBLICATIONS

Brütting, W., et al, "More Light from Organic Light-Emitting Diodes," Europhysics News, vol. 42, No. 4, Jul. 27, 2011, pp. 20-24.
(Continued)

*Primary Examiner* — Minh-Loan Tran
(74) *Attorney, Agent, or Firm* — Slater & Matsil, L.L.P.

(57) ABSTRACT

An organic light-emitting component includes a substrate, on which are applied an optical coupling-out layer, a translucent electrode on the coupling-out layer, an organic hole-conducting layer or an organic electron-conducting layer on the translucent electrode, an organic light-emitting layer thereon, an organic electron-conducting layer or an organic hole-conducting layer on the organic light-emitting layer, and a reflective electrode. The organic light-emitting layer is at a distance of greater than or equal to 150 nm from the reflective electrode.

16 Claims, 2 Drawing Sheets

(52) U.S. Cl.
CPC ........ *H01L51/5218* (2013.01); *H01L 51/5234* (2013.01); *H01L 51/5262* (2013.01); *H01L 51/5271* (2013.01); *H01L 51/56* (2013.01); *H01L 51/5076* (2013.01); *H01L 2251/558* (2013.01)

(56) References Cited

U.S. PATENT DOCUMENTS

| | | |
|---|---|---|
| 2004/0227460 A1 | 11/2004 | Liao et al. |
| 2006/0273714 A1 | 12/2006 | Forrest et al. |
| 2007/0063628 A1 | 3/2007 | Cok et al. |
| 2007/0257608 A1 | 11/2007 | Tyan et al. |
| 2008/0218063 A1 | 9/2008 | Greiner |
| 2012/0286258 A1 | 11/2012 | Naraoka et al. |

FOREIGN PATENT DOCUMENTS

| | | |
|---|---|---|
| DE | 102008022830 A1 | 6/2009 |
| DE | 102009037185 A1 | 12/2010 |
| DE | 102010054893 A1 | 6/2012 |
| JP | 2003344869 | 12/2003 |
| JP | 2007035432 | 2/2007 |
| JP | 2008543074 A | 11/2008 |
| JP | 2011119282 | 6/2011 |
| WO | 2006129265 A2 | 12/2006 |
| WO | 2011132773 A1 | 10/2011 |

OTHER PUBLICATIONS

Do, Y., et al., "Enhanced Light Extraction from Organic Light-Emitting Diodes with 2D SiO2/SiNx Photonic Crystals," Advanced Materials, vol. 15, Issue 14, Jul. 21, 2003, pp. 1214-1218.

Sun, Y., et al., "Enhanced Light Out-Coupling of Organic Light-Emitting Devices Using Embedded Low-Index Grids," Nature Photonics, vol. 2, Jul. 11, 2008, pp. 483-487.

Ziebarth, J.M., et al., "Extracting Light from Polymer Light-Emitting Diodes Using Stamped Bragg Gratings," Advanced Functional Materials, vol. 14, No. 5, May 18, 2004, pp. 451-456.

\* cited by examiner

ORGANIC LIGHT-EMITTING COMPONENT HAVING A LAYER WITH A LOW ABSORPTION COEFFICIENT

This patent application is a national phase filing under section 371 of PCT/EP2012/072233, filed Nov. 9, 2012, which claims the priority of German patent application 10 2011 086 255.2, filed Nov. 14, 2011, each of which is incorporated herein by reference in its entirety.

TECHNICAL FIELD

An organic light-emitting component is specified.

BACKGROUND

In organic light-emitting diodes (OLEDs), only part of the generated light is coupled out directly. The rest of the light generated in the active region is distributed among various loss channels, for instance in light guided in the substrate, in a transparent electrode and in organic layers as a result of waveguiding effects, and also in surface plasmons that can be generated in a metallic electrode. The waveguiding effects arise, in particular, as a result of the differences in refractive index at the interfaces between the individual layers and regions of an OLED.

Typically, in known OLEDs, only approximately one quarter of the light generated in the active region is coupled out into the surroundings, that is to say air, for example, while the emission is deprived by virtue of approximately 25% of the generated light being lost as a result of waveguiding in the substrate, approximately 20% of the generated light being lost as a result of waveguiding in a transparent electrode and the organic layers and approximately 30% being lost as a result of the generation of surface plasmons in a metallic electrode. In particular, the light guided in the loss channels cannot be coupled out from an OLED without additional technical measures.

In order to increase the coupling-out of light and thus the emitted light power, measures are known, for example, for coupling out the light guided in a substrate into emitted light. For this purpose, by way of example, films comprising scattering particles, and films comprising surface structures such as microlenses, for instance, are used on the outer side of the substrate. It is also known to provide a direct structuring of the outer side of the substrate or to introduce scattering particles into the substrate. Some of these approaches, for example, the use of scattering films, are already in use commercially and can be scaled up with regard to the emission area in particular in the case of OLEDs embodied as lighting modules. However, these approaches for coupling out light have the major disadvantages that the coupling-out efficiency is limited to approximately 60-70% of the light guided in the substrate, and that the appearance of the OLED is influenced significantly, since a milky, diffusely reflective surface is produced by the applied layers or films.

Furthermore, approaches are known for coupling out the light guided in organic layers or in a transparent electrode. However, to date these approaches have not yet become established commercially in OLED products. By way of example, the document Y. Sun, S. R. Forrest, Nature Photonics 2, 483 (2008) proposes forming so-called "low-index grids", wherein structured regions comprising a material having a low refractive index are applied to a transparent electrode. Furthermore, it is also known to apply high refractive index scattering regions below a transparent electrode in a polymeric matrix, as is described in U.S. Publication No. 2007/0257608, for example. In this case, the polymeric matrix generally has a refractive index in the region of n=1.5 and is applied wet-chemically. Furthermore, so-called Bragg gratings or photonic crystals having periodic scattering structures having structure sizes in the light wavelength range are also known, as are described in the documents Ziebarth et al., Adv. Funct. Mat. 14, 451 (2004) and Do et al., Adv. Mat. 15, 1214 (2003), for example.

However, by means of such measures, that proportion of the light generated in the active region of an OLED which is converted into plasmons cannot be influenced or even coupled out.

SUMMARY OF THE INVENTION

Specific embodiments specify an organic light-emitting component which has an improved efficiency and coupling-out of light.

In accordance with at least one embodiment, an organic light-emitting component comprises on a substrate a translucent electrode and a reflective electrode, between which an organic functional layer stack is arranged.

Here and hereinafter, "translucent" denotes a layer which is transmissive to visible light. In this case, the translucent layer can be transparent, that is to say clearly translucent, or at least partly light-scattering and/or partly light-absorbing, such that the translucent layer can, for example, also be diffusely or milky translucent. Particularly preferably, a layer designated here as translucent is embodied such that it is as transparent as possible, with the result that, in particular, the absorption of light is as low as possible.

In accordance with a further embodiment, the organic functional layer stack comprises at least one organic light-emitting layer arranged between a hole-conducting layer and an electron-conducting layer. By way of example, on the translucent electrode it is possible to arrange the organic hole-conducting layer, thereabove the at least one organic light-emitting layer and, above the latter, the organic electron-conducting layer. As an alternative thereto, the organic functional layer stack can also have a structure inverted with respect thereto, that is to say that in this case, on the translucent electrode, there are arranged the organic electron-conducting layer, thereabove the at least one organic light-emitting layer and, above the latter, the organic hole-conducting layer.

In accordance with a further particularly preferred embodiment, the substrate is embodied in a translucent fashion and the translucent electrode is arranged between the translucent substrate and the organic functional stack, such that light generated in the at least one organic light-emitting layer can be emitted through the translucent electrode and the translucent substrate. An organic light-emitting component of this type can also be designated as a so-called "bottom emitter". By way of example, the substrate can comprise one or more materials in the form of a layer, a plate, a film or a laminate which are selected from glass, quartz, plastic, metal, silicon wafer. Particularly preferably, the substrate comprises glass, for example, in the form of a glass layer, glass film or glass plate, or is composed thereof.

In accordance with a further embodiment, an optical coupling-out layer is applied on the substrate, the translucent electrode in turn being arranged on said optical coupling-out layer. The optical coupling-out layer may be suitable and provided in particular for so-called internal coupling-out, that is to say for reducing that portion of the radiation power generated in the light-emitting layer or of the light which is generated there and which is guided in organic layers and/or in the translucent electrode. Particularly preferably, the optical coupling-out layer can comprise a material which has a refractive index of greater than or equal to 1.6. In particular, it may be advantageous if the refractive index of the optical coupling-out layer is greater than or equal to 1.8 and particularly preferably greater than or equal to 1.85. It is particularly advantageous if the optical coupling-out layer has a refractive index that is greater than or equal to a layer-thickness-weighted average refractive index of the organic functional layers and the translucent electrode.

The optical coupling-out layer can comprise, for example, so-called high refractive index glass, that is to say glass having a refractive index of greater than or equal to 1.8 and particularly preferably greater than or equal to 1.85, for example having a refractive index of 1.9.

Furthermore, it is also possible for the optical coupling-out layer to comprise an organic material, in particular a polymer-based material, which can be applied to the substrate wet-chemically, for example. For this purpose, by way of example, the optical coupling-out layer can comprise one or more of the following materials: polycarbonate (PC), polyethylene phthalate (PEN), polyethylene terephthalate (PET), polyurethane (PU), polyacrylate, for example, polymethyl methacrylate (PMMA), epoxide.

In accordance with a further embodiment, the optical coupling-out layer is light-scattering. For this purpose, the optical coupling-out layer comprises scattering centers, for example, which are arranged in a manner distributed in one of the abovementioned materials. For this purpose, the abovementioned materials form a matrix material in which the scattering centers are embedded. The scattering centers can be formed by regions and/or particles having a higher or lower refractive index than the matrix material. By way of example, the scattering centers can be formed by particles, for example, $SiO_2$, $TiO_2$, $ZrO_2$, $Al_2O_3$, or by pores, which can be air-filled, for example.

In accordance with a further particularly preferred embodiment, the at least one organic light-emitting layer is at a distance of greater than or equal to 150 nm from the reflective electrode. That can mean, in particular, that the organic functional layers of the organic functional layer stack that are arranged between the at least one organic light-emitting layer and the reflective electrode have a total thickness of greater than or equal to 150 nm. Particularly preferably, the charge-carrier-conducting layer, that is to say—depending on the arrangement described above—the electron-conducting layer or the hole-conducting layer, arranged between the at least one organic light-emitting layer and the reflective electrode has such a thickness.

In one particularly preferred embodiment, the organic light-emitting component comprises a translucent substrate, on which are applied an optical coupling-out layer and, above the latter, a translucent electrode and thereabove an organic functional layer stack having organic functional layers comprising an organic hole-conducting layer on the translucent electrode, at least one organic light-emitting layer on the hole-conducting layer and thereabove an organic electron-conducting layer. A reflective electrode is arranged thereabove, wherein the at least one organic light-emitting layer is at a distance of greater than or equal to 150 nm from the reflective electrode.

In a further particularly preferred embodiment, the organic light-emitting component comprises a translucent substrate, on which are applied an optical coupling-out layer and, above the latter, a translucent electrode and thereabove an organic functional layer stack having organic functional layers comprising an organic electron-conducting layer on the translucent electrode, at least one organic light-emitting layer on the electron-conducting layer and thereabove an organic hole-conducting layer. A reflective electrode is arranged thereabove, wherein the at least one organic light-emitting layer is at a distance of greater than or equal to 150 nm from the reflective electrode.

In accordance with a further embodiment, no further organic light-emitting layer is arranged between the at least one organic light-emitting layer at the distance of greater than or equal to 150 nm from the reflective electrode and the reflective electrode. In other words, only non-radiative organic functional layers, that is to say in particular—depending on the arrangement described above—the hole-conducting layer or the electron-conducting layer, is then situated between the reflective electrode and the at least one organic light-emitting layer, such that the at least one organic light-emitting layer at the distance of greater than or equal to 150 nm from the reflective electrode is the light-emitting layer of the organic functional layer stack that is closest to the reflective electrode. The reflective electrode can, in particular, also directly adjoin the hole-conducting layer or the electron-conducting layer.

In accordance with a further embodiment, the optical length between the at least one light-emitting layer and the reflective electrode for a wavelength of 600 nm, for example, is greater than or equal to 1.6 times 150 nm and less than or equal to 1.8 times 225 nm. In this case, the values 1.6 and 1.8 correspond to a range of preferred refractive index values.

Particularly preferably, the distance between the at least one organic light-emitting layer and the reflective electrode can be greater than or equal to 180 nm and less than or equal to 225 nm.

The inventors have established that the distance between the at least one organic light-emitting layer and the reflective electrode, as described here, particularly advantageously results in a reduction of that relative proportion of the radiation power generated in the light-emitting layer or of the light generated in the light-emitting layer which is coupled into the reflective electrode in the form of plasmons. In particular, the inventors have established that the distance between the at least one organic light-emitting layer and the reflective electrode can be chosen in such a way that that relative proportion of the radiation power generated in the at least one organic light-emitting layer which is coupled into the reflective electrode in the form of plasmons, in particular surface plasmons, is less than or equal to 10%. Accordingly, given such a distance, that proportion of the generated radiation power or of the generated light which is guided in the organic layers and/or the translucent electrode as a result of waveguiding effects is increased. In contrast to plasmons, said proportion can be coupled out from the organic light-emitting component at least partly with the aid of the optical coupling-out layer, such that, in the case of the organic light-emitting component described here, it is possible to increase the light power emitted through the substrate in comparison with known OLEDs having a typically significantly smaller distance between the at least one organic light-emitting layer and the reflective electrode.

Furthermore, an encapsulation arrangement can also be arranged above the electrodes and the organic layers. The encapsulation arrangement can be embodied, for example, in the form of a glass cover or, preferably, in the form of a thin-film encapsulation.

A glass cover, for example, in the form of a glass substrate with a cavity, can be adhesively bonded by means of an adhesive layer on the substrate. Furthermore, a moisture-absorbing substance (getter), for example, composed of zeolite, can be adhesively bonded into the cavity in order to bind moisture or oxygen which can penetrate through the adhesive.

In the present case, an encapsulation arrangement embodied as a thin-film encapsulation is understood to mean a device suitable for forming a barrier in relation to atmospheric substances, in particular in relation to moisture and oxygen and/or in relation to further harmful substances such as, for instance, corrosive gases, for example, hydrogen sulfide. In other words, the thin-film encapsulation is embodied in such a way that at most very small proportions of atmospheric substances can penetrate through it. In the case of the thin-film encapsulation, this barrier effect is produced substantially by barrier layers and/or passivation layers which are embodied as thin layers and which are part of the encapsulation arrangement. The layers of the encapsulation arrangement generally have a thickness of less than or equal to a few 100 nm.

In particular, the thin-film encapsulation can comprise or consist of thin layers which are responsible for the barrier effect of the encapsulation arrangement. The thin layers can be applied, for example, by means of an atomic layer deposition (ALD) method. Suitable materials for the layers of the encapsulation arrangement are, for example, aluminum oxide, zinc oxide, zirconium oxide, titanium oxide, hafnium oxide, lanthanum oxide, tantalum oxide. Preferably, the encapsulation arrangement comprises a layer sequence having a plurality of the thin layers, each having a thickness of between one atomic layer and 10 nm, inclusive of the limits.

As an alternative or in addition to thin layers produced by means of ALD, the encapsulation arrangement can comprise at least one or a plurality of further layers, that is to say in particular barrier layers and/or passivation layers, deposited by thermal vapor deposition or by means of a plasma-assisted process, for instance sputtering or plasma-enhanced chemical vapor deposition (PECVD). Suitable materials for this may be the abovementioned materials and also silicon nitride, silicon oxide, silicon oxynitride, indium tin oxide, indium zinc oxide, aluminum-doped zinc oxide, aluminum oxide and mixtures and alloys of the materials mentioned. The one or the plurality of further layers can, for example, each have a thickness of between 1 nm and 5 µm and preferably between 1 nm and 400 nm, inclusive of the limits.

Furthermore, in particular in the case of an optical coupling-out layer formed from a polymer, it may be possible that an encapsulation arrangement embodied as a thin-film encapsulation is formed on said optical coupling-out layer below the translucent electrode. In particular in the case of an optical coupling-out layer that is not hermetically impermeable, the organic light-emitting component can thus be sealed and encapsulated from below, that is to say beneath the translucent electrode.

The inventors have established that the further embodiments and features described below can affect the efficiency and coupling-out of light of the organic light-emitting component described here with the above-described embodiments and features and in particular the above-described distance between the at least one organic light-emitting layer and the reflective electrode with a particularly advantageous effect on increasing efficiency and the coupling-out of light, such that the embodiments and features described here can in particular also be understood as construction rules for a particularly efficient layer architecture for the organic light-emitting component, which can in particular also be distinguished in terms of their advantageous interaction.

In accordance with a further embodiment, the translucent electrode has a refractive index that is matched to the refractive index of the organic layers and preferably corresponds to the layer-thickness-weighted average value of the refractive indexes of the organic layers. The translucent electrode can have, in particular, a refractive index of greater than or equal to 1.6 and particularly preferably of greater than or equal to 1.7. A refractive index for the translucent electrode in a range of greater than or equal to 1.7 and less than or equal to 2.1 has also proved to be particularly advantageous.

In accordance with a further embodiment, the translucent electrode has a low absorption, in particular in a spectral range of more than 450 nm, for example, in a visible spectral range of between 450 nm and 640 nm. Particularly preferably, the translucent electrode has an absorption coefficient k of less than or equal to 0.005 in such a spectral range. In particular, the total transmission of the translucent electrode should not fall below 80%, and should therefore be greater than or equal to 80%, in the visible spectral range.

In accordance with a further embodiment, the translucent electrode is embodied as an anode and can therefore serve as a hole-injecting material. The reflective electrode is then embodied as a cathode. As an alternative thereto, the translucent electrode can also be embodied as a cathode and thus serve as an electron-injecting material. The reflective electrode is then embodied as an anode. The embodiment of the translucent electrode and of the reflective electrode as anode or cathode depends, in particular, on the above-described construction of the organic functional layer stack.

The translucent electrode can, for example, comprise a transparent conductive oxide or consist of a transparent conductive oxide. Transparent conductive oxides ("TCO" for short) are transparent conductive materials, generally metal oxides, such as, for example, zinc oxide, tin oxide, cadmium oxide, titanium oxide, indium oxide or indium tin oxide (ITO). Alongside binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped.

In accordance with a further preferred embodiment, the translucent electrode comprises ITO or is composed thereof In particular, the translucent electrode in this case can have a thickness of greater than or equal to 50 nm and less than or equal to 200 nm. In such a thickness range, the transmission in the visible spectral range of the translucent electrode is greater than or equal to 80% and the resistivity $\rho$ is in a range of approximately 150 to 500 $\mu\Omega\cdot cm$.

In accordance with a further embodiment, the reflective electrode comprises a metal, which can be selected from aluminum, barium, indium, silver, gold, magnesium, calcium and lithium, and compounds, combinations and alloys. In particular, the reflective electrode can comprise Ag, Al or alloys comprising these, for example, Ag:Mg, Ag:Ca, Mg:Al. Alternatively, or additionally, the reflective electrode can also comprise one of the TCO materials mentioned above.

Furthermore, it is also possible for the reflective electrode to comprise at least two or more layers and to be embodied as a so-called bilayer or multilayer electrode. By way of example, the reflective electrode can have for this purpose, in a manner facing the organic layers, an Ag layer having a thickness of greater than or equal to 30 nm and less than or equal to 50 nm, on which an aluminum layer is applied. It is also possible for the reflective electrode, as an alternative to metal-metal layer combinations or metal-multilayer combinations, to have one or more TCO layers in combination with at least one metal layer. By way of example, the reflective electrode can have a combination of a TCO layer and a silver layer. It is also possible for a metal layer to be arranged between two TCO layers, for example. In such embodiments, one of the layers or a plurality of layers can also be embodied as nucleation layers.

Furthermore, it is also possible for the reflective electrode to have further optical matching layers for setting the reflectivity or the reflected spectral range. Such optical matching layers can be advantageous in particular in the case of monochromatically emitting organic light-emitting layers or monochromatically emitting organic light-emitting components. For this purpose, an optical matching layer should advantageously be conductive and can comprise, for example, one or more TCO layers arranged one above another in a Bragg-mirror-like arrangement.

Particularly preferably, the reflective electrode has a reflectivity of greater than or equal to 80% in the visible spectral range.

The reflective electrode can be produced, for example, by means of a physical vapor deposition method (PVD), by means of electron beam evaporation and/or by means of sputtering.

The organic functional layers between the translucent electrode and the reflective electrode, that is to say at least the hole-conducting layer, the at least one organic light-emitting layer and the electron-conducting layer, can comprise organic polymers, organic oligomers, organic monomers, organic small, non-polymeric molecules or low molecular weight compounds ("small molecules") or combinations thereof.

In accordance with a further embodiment, the charge-carrier-conducting layer between the at least one organic light-emitting layer and the reflective electrode, that is to say—depending on the configuration of the organic functional layer stack in accordance with the above embodiments—the electron-conducting layer or the hole-conducting layer, comprises a dopant. In particular, the charge-carrier-conducting layer has a thickness which corresponds to the abovementioned distance. On account of the large thickness of such a charge-carrier-conducting layer, the dopant advantageously increases the conductivity in order that the operating voltage of the organic light-emitting component is kept low.

In accordance with a further embodiment, the hole-conducting layer comprises at least one hole injection layer, a hole transport layer or a combination thereof In particular, doped layers composed of molecular compounds and also doped layers composed of electrically conductive polymers are appropriate as hole transport layer or hole injection layer. By way of example, tertiary amines, carbazole derivates, conductive polyaniline or polyethylene dioxythiophene may prove to be advantageous as materials in particular for a hole transport layer. Furthermore, the following materials may be suitable:

N,N'-bis(naphthalene-1-yl)-N,N'-bis(phenyl)-benzidine (NPB),
N,N'-bis(naphthalene-2-yl)-N,N'-bis(phenyl)-benzidine (β-NPB),
N,N'-bis(3-methylphenyl)-N,N'-bis(phenyl)-benzidine (TPD),
N,N'-bis(3-methylphenyl)-N,N'-bis(phenyl)-9,9-spirobifluorene (Spiro-TPD),
N,N'-bis(naphthalene-1-yl)-N,N'-bis(phenyl)-9,9-spirobifluorene (Spiro-NPB),
N,N'-bis(3-methylphenylene)-N,N'-bis(phenyl)-9,9-dimethyl-fluorene (DMFL-TPD),
N,N'-bis(naphthalene-1-yl)-N,N'-bis(phenyl)-9,9-dimethylfluorene (DMFL-NPB),
N,N'-bis(3-methylphenylene)-N,N'-bis(phenyl)-9,9-diphenyl-fluorene (DPFL-TPD),
N,N'-bis(naphthalene-1-yl)-N,N'-bis(phenyl)-9,9-diphenylfluorene (DPFL-NPB),
2,2',7,7'-tetrakis(N,N-diphenylamino)-9,9'-spirobifluorene (Spiro-TAD),
9,9-bis[4-(N,N-bis-biphenyl-4-yl-amino)phenyl]-9H-fluorene (BPAPF),
9,9-bis[4-(N,N-bis-naphthalene-2-yl-amino)phenyl]-9H-fluorene (NPAPF),
9,9-bis[4-(N,N-bis-naphthalen-2-yl-N,N'-bis-phenyl-amino)phenyl]-H-fluorene (NPBAPF),
2,2',7,7'-tetrakis[N-naphthalenyl(phenyl)amino]-9,9-spirobifluorene (Spiro-2NPB),
N,N'-bis(phenanthrene-9-yl)-N,N'-bis(phenyl)-benzidine (PAPB),
2,7-bis[N,N-bis(9,9-spirobifluoren-2-yl)amino]-9,9-spirobifluorene (Spiro-S),
2,2'-bis[N,N-bis(biphenyl-4-yl)amino]-9,9-spirobifluorene (2,2'-Spiro-DBP),
2,2'-bis(N,N-diphenylamino)-9,9-spirobifluorene (Spiro-BPA).

The dopant used in this case can be, for example, a metal oxide, an organometallic compound, an organic material or a mixture thereof, for example, $WO_3$, $MoO_3$, $V_2O_5$, $Re_2O_7$ and $Re_2O_5$, di-rhodium tetra-trifluoroacetate ($Rh_2(TFA)_4$) or the isoelectronic ruthenium compound $Ru_2(TFA)_2(CO)_2$ or an organic material which comprises aromatic functional groups or is an aromatic organic material, for example, aromatic materials having a pronounced number of fluorine and/or cyanide(CN) substituents.

Low molecular weight compounds can be applied, in particular, by thermal evaporation in a vacuum (vacuum thermal evaporation, VTE, or physical vapor deposition, PVD) or from the liquid phase. Polymeric materials can, for example, be applied from the liquid phase or be formed by concatenation of low molecular weight starting materials on the surface of the translucent electrode. A combination of both approaches is likewise possible, in which a thin layer of a p-doped hole injection layer having a thickness of 10 to 20 nm is vapor-deposited on a hole injection layer that was applied by means of a liquid method.

The hole-conducting layer preferably has a refractive index of greater than or equal to 1.6 and is particularly preferably in a range of greater than or equal to 1.6 and less than or equal to 1.9.

In accordance with a further embodiment, the light-emitting layer comprises an electroluminescent material and is particularly preferably embodied as an electroluminescent layer or electroluminescent layer stack. Suitable materials for this purpose include materials which exhibit radiation emission on account of fluorescence or phosphorescence, for example, polyfluorene, polythiophene or polyphenylene or derivatives, compounds, mixtures or copolymers thereof, for example, 2- or 2,5-substituted poly-p-phenylenevinylene, and metal complexes, for example, iridium complexes such as blue phosphorescent FIrPic (bis(3,5-difluoro-2-(2-pyridyl)phenyl-(2-carboxypyridypiridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine]ruthenium(III)complex) and blue phosphorescent DPAVBi (4,4-bis[4-(di-p-tolylamino)styryl]biphenyl), green fluorescent TTPA (9,10-bis[N,N-di-(p-tolypamino]anthracene) and red fluorescent DCM2 (4-dicyanomethylene)-2-methyl-6-julolidyl-9-enyl-4H-pyran).

Materials which exhibit both fluorescence and phosphorescence are also possible. The materials of the light-emitting layer can furthermore also utilize so-called singlet or triplet harvesting, known to the person skilled in the art. Depending on the materials of the at least one organic light-emitting layer, the latter can generate monochromatic, bichromatic or polychromatic light, for example, white light.

In accordance with a further embodiment, the electron-conducting layer comprises at least one electron injection layer, an electron transport layer or a combination thereof By way of example, the following materials may be suitable for the electron-conducting layer: 8-hydroxyquinolinolato-lithium (Liq), 2,2',2"-(1,3,5-benzinetriyl)-tris(1-phenyl-1-H-benzimidazole) (TPBi), 2-(4-bihenylyl)-5-(4-tert-butylphenyl)-1,3,4-oxadiazole (PBD), 2,9-dimethyl-4,7-diphenyl-1,10-phenanthroline (BCP), 4,7-diphenyl-1,10-phenanthroline (BPhen), bis-(2-methyl-8-quinolinolate)-4-(phenylphenolato)aluminum (BAlq), 1,3-bis[2-(2,2'-bipyridine-6-yl)-1,3,4-oxadiazol-5-yl]benzene (Bpy-OXD), 6,6'-bis[5-(biphenyl-4-yl)-1,3,4-oxadiazol-2-yl]-2,2'-bipyridyl (BP-OXD-Bpy), 3-(4-biphenylyl)-4-phenyl-5-tert-butylphenyl-1,2,4-triazole (TAZ), 4-(naphthalene-1-yl)-3,5-diphenyl-4H-1,2,4-triazole (NTAZ), 2,9-bis(naphthalene-2-yl)-4,7-diphenyl-1,10-phenanthroline (NBphen), 2,7-bis[2-(2,2'-bipyridine-6-yl)-1,3,4-oxadiazol-5-yl]-9,9-dimethylfluorene (Bby-FOXD), 1,3-bis[2-(4-tert-butylphenyl)-1,3,4-oxadiazol-5-yl]benzene (OXD-7).

The dopant used in this case may be, for example, an alkali metal, an alkali metal salt, an alkaline earth metal salt, an organometallic compound, a molecular doping or a mixture thereof, for example, Li, $Cs_3Po_4$, $Cs_2CO_3$, a metallocene, that is to say an organometallic compound comprising a metal M and two cyclopentadienyl radicals (Cp) in the form $M(Cp)_2$, or a metal-hydropyrimidopyrimidine complex. The metal can comprise or be, for example, tungsten, molybdenum and/or chromium.

By way of example, the electron-conducting layer can comprise an electron transport layer comprising, for example, 2,9-dimethyl-4,7-diphenyl-1,10-phenanthroline (BCP) or 4,7-diphenyl-1,10-phenanthroline (BPhen). This material can preferably comprise a dopant selected from Li, $Cs_2CO_3$, $Cs_3PO_4$ or a molecular doping.

In addition to the organic hole-conducting layer, the at least one organic light-emitting layer and the organic electron-conducting layer, one or more further organic layers can be present in the organic functional layer stack. In particular, by way of example, a hole-blocking layer can be arranged between the electron-conducting layer and the light-emitting layer. It is also possible for an electron-blocking layer to be arranged between the hole-conducting layer and the light-emitting layer.

The inventors have established that it is particularly advantageous if the organic layers of the organic functional layer stack, in particular those which have a thickness of greater than or equal to 5 nm, have an absorption coefficient k of less than or equal to 0.005 in the visible spectral range, that is to say for wavelengths of greater than 450 nm. In particular, this also applies to the hole-conducting layer, which can comprise, for example, a hole transport layer having a thickness of up to 350 nm.

In accordance with a further embodiment, as at least one organic light-emitting layer, a plurality of light-emitting layers are arranged between the hole-conducting layer and the electron-conducting layer. In this case, the plurality of light-emitting layers can form a layer stack. Furthermore, it is also possible for an electron-conducting layer and a hole-conducting layer in each case to be arranged between adjacent light-emitting layers. The organic light-emitting component can comprise, in particular, between the translucent electrode and the reflective electrode, at least two or more functional layer stack units each comprising at least one organic electron-conducting layer and an organic hole-conducting layer with an organic light-emitting layer arranged therebetween. The functional layer stack units can be connected in series in such a way that an electron-conducting layer of a layer stack unit adjoins a hole-conducting layer of an adjacent layer stack unit, or vice versa. Such a combination of adjacent electron- and hole-conducting layers, between which an undoped layer functioning as a charge carrier generation zone can furthermore be arranged, can also be designated as a so-called "charge generation layer" (CGL).

The at least one organic light-emitting layer in the form of a single light-emitting layer or a plurality of light-emitting layers can particularly preferably emit visible light in a narrow or wide wavelength range, that is to say monochromatic or multicolored or else, for example, white light. For this purpose, the at least one organic light-emitting layer, in the form of a single layer or a plurality of light-emitting layers, can comprise one or a plurality of organic light-emitting materials. Multicolored or white light can be generated by the combination of different organic light-emitting materials in the at least one light-emitting layer.

In the case of a plurality of organic light-emitting layers, in particular in the case of layer stack units arranged one above another, the organic light-emitting layers can preferably be present in one of the following combinations:

One of the light-emitting layers emits red and green light, and a further light-emitting layer emits blue light.

There are at least two or three light-emitting layers present, which all emit white light.

There are at least three light-emitting layers present, of which one emits red light, one emits yellow light and one emits blue light.

There are at least three light-emitting layers present, of which one emits red and green light and two light-emitting layers emit blue light. In this case, both the blue-emitting layers and the red- and green-emitting layers can form the bottommost or topmost light-emitting layers, for example, as viewed from the substrate.

The organic layers of the organic light-emitting component described here, in accordance with the embodiments described above, can have a total thickness of at least 250 nm. In the case of a plurality of light-emitting layers, in particular in the case of a plurality of functional layer stack units arranged one above another, the total thickness of the organic layers can be up to 1 µm.

In the organic light-emitting component described here, as a result of the distance of greater than or equal to 150 nm between the at least one organic light-emitting layer and the reflective electrode, it is possible to achieve effective suppression of the plasmon loss channel described above, as a result of which in particular together with the optical coupling-out layer between the translucent substrate and the translucent electrode, it is possible to achieve an increase in efficiency in comparison with known OLEDs. It is particularly advantageous in this case if the optical coupling-out layer and the translucent electrode have the refractive indices mentioned above.

BRIEF DESCRIPTION OF THE DRAWINGS

Further advantages, advantageous embodiments and developments will become apparent from the exemplary embodiments described below in conjunction with the figures.

In the figures.

Figure 1A:
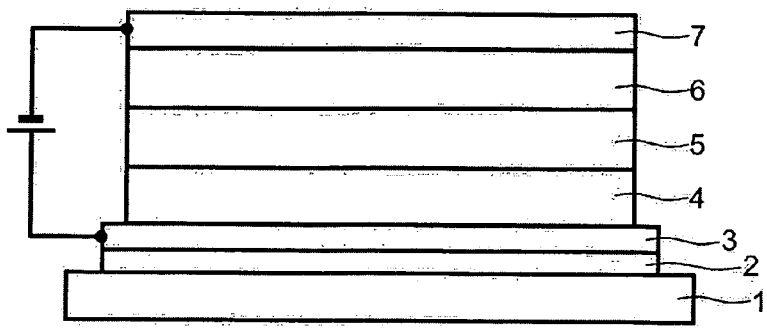
FIG. 1A shows a schematic illustration of an organic light-emitting component in accordance with one exemplary embodiment.

In the exemplary embodiments and figures, elements that are identical, of identical type or act identically may be provided in each case with the same reference signs. The illustrated elements and their size relationships among one another should not be regarded as true to scale; rather, individual elements, such as, for example, layers, structural parts, components and regions, may be illustrated with an exaggerated size in order to enable better illustration and/or in order to afford a better understanding.

DETAILED DESCRIPTION OF ILLUSTRATIVE EMBODIMENTS

FIG. 1 shows one exemplary embodiment of an organic light-emitting component 100. The latter comprises a substrate 1, on which an optical coupling-out layer 2 is applied. Above the optical coupling-out layer 2, a translucent electrode 3 and a reflective layer 7 are applied, between which is arranged an organic functional layer stack comprising organic functional layers comprising an organic hole-conducting layer 4, at least one organic light-emitting layer 5 and an organic electron-conducting layer 6.

The organic light-emitting component is embodied as a so-called "bottom emitter" and for this purpose comprises a translucent substrate composed of glass. As an alternative thereto, the substrate 1 can also comprise or be composed of a different translucent material, for example, a plastic or a glass-plastic laminate.

For the purpose of effectively coupling out light, the optical coupling-out layer 2 has a refractive index that is greater than or equal to a layer-thickness-weighted average refractive index of the organic functional layers and the translucent electrode 3. In the exemplary embodiment shown, the optical coupling-out layer 2 likewise comprises for this purpose glass, in particular high refractive index glass having a refractive index of approximately 1.9. As an alternative thereto, the optical coupling-out layer 2 can also be based on a polymer material, as described above in the general part.

Furthermore, the coupling-out layer 2 comprises scattering centers distributed in the glass material in the form of particles or pores which have a higher or lower refractive index than the glass material. In the case of pores, the latter can be air-filled, for example, while SiO2, TiO2, ZrO2 and/or Al2O3, for example, can be used as particles. The optical coupling-out layer 2 can bring about the effect that, as described above in the general part, at least part of the light wave-guided in the translucent electrode 3 or in the organic layers, in particular in the hole-conducting layer 4, can be coupled out from the organic light-emitting component 100 through the substrate 1.

Furthermore, an encapsulation arrangement can also be arranged above the electrodes 3, 7 and the organic layers 4, 5, said encapsulation arrangement not being shown for the sake of clarity. The encapsulation arrangement can be embodied, for example, in the form of a glass cover or, preferably, in the form of a thin-film encapsulation, as described above in the general part.

Furthermore, in particular in the case of an optical coupling-out layer 2 comprising a polymer, it may be necessary for an encapsulation arrangement embodied as a thin-film encapsulation also to be formed on said optical coupling-out layer below the translucent electrode 3, as described above in the general part.

The translucent electrode 3 has a refractive index of greater than or equal to 1.6 and preferably of greater than or equal to 1.7 and less than or equal to 2.1. Furthermore, the thickness and material of the translucent electrode 3 are chosen in such a way that the absorption coefficient in a visible spectral range of 450 nm to 640 nm is less than or equal to 0.005. In particular, the transmission of the translucent electrodes 3 in the visible spectral range is greater than or equal to 80%.

In the exemplary embodiment shown, for this purpose, the translucent electrode is composed of indium tin oxide (ITO) having a thickness of greater than or equal to 50 nm and less than or equal to 200 nm. What can also be achieved as a result is that the resistivity of the translucent electrode 3 is in a range of greater than or equal to 150 and less than or equal to 500 $\mu\Omega\cdot cm$, as a result of which a sufficiently high conductivity of the translucent electrode 3 can be ensured.

The hole-conducting layer 4 comprises at least one hole transport layer, which can have a thickness of up to 350 nm. Furthermore, the hole-conducting layer 4, between the hole transport layer and the translucent electrode 3, can comprise a hole injection layer, which can have a thickness in the range of a few tens of nanometers. Both the hole transport and the hole injection layers can be composed of the materials described above in the general part, for example, of low molecular weight compounds ("small molecules") or polymers.

The at least one organic light-emitting layer 5 comprises at least one organic material which emits light in a visible wavelength range during the operation of the organic light-emitting component 100, as is indicated by the schematically indicated interconnection of the electrodes 3 and 7. In this case, the organic light-emitting layer 5 can comprise one or more of the materials mentioned above in the general part.

In the exemplary embodiment shown, the electron-conducting layer 6 is arranged in a manner directly adjoining the reflective electrode 7 and has a thickness of greater than or equal to 150 nm and preferably greater than or equal to 180 nm. As a result, the at least one organic light-emitting layer 5 is at a distance of greater than or equal to 150 nm, and preferably greater than or equal to 180 nm, from the reflective electrode 7. Taking account of the customary refractive indices in the organic functional layer stack, particularly preferably the optical length between the at least one light-emitting layer 5 and the reflective electrode at a wavelength of 600 nm is greater than or equal to 1.6×150 nm and less than or equal to 1.8×225 nm. In particular, a range of between 150 nm and 225 nm and preferably between 180 nm and 220 nm, in each case inclusive of the limits, has proved to be particularly advantageous for the distance.

In order to ensure a sufficiently high conductivity of the electron-conducting layer 6 in the case of the thickness mentioned above, said layer is conductivity-doped. In the exemplary embodiment shown, the electron-conducting layer comprises an electron transport layer comprising as matrix material BCP or BPhen doped with Li, $Cs_2CO_3$, $Cs_3PO_4$ or by means of a molecular doping.

Furthermore, the electron-conducting layer 6, between the electron transport layer and the reflective electrode 7, can comprise an electron injection layer. In this case, the above-mentioned thickness of the electron-conducting layer 6 relates to a total thickness of the electron injection layer and the electron transport layer. In addition, by way of example, at least one further organic layer, for example, a hole-blocking layer, can be arranged between the organic light-emitting layer 5 and the electron-conducting layer 6. The total thickness of all the organic functional layers arranged between the organic light-emitting layer 5 and the reflective electrode is chosen such that the above-described distance between the organic light-emitting layer 5 and the reflective electrode 7 is achieved.

In the exemplary embodiment shown, the reflective electrode is composed of metal and comprises, in particular, Ag, Al or alloys such as Ag:Mg, Ag:Ca or Mg:Al. As an alternative thereto, it is also possible for the reflective electrode 7 to comprise at least two or more metal layers or one or more TCO layers in combination with one or more metal layers. By way of example, the reflective electrode 7 can also comprise optical matching layers, for example, composed of a TCO layer stack having a Bragg-mirror-like embodiment, in order to match the reflectivity of the reflective electrode 7 to the emission spectrum of the light-emitting layer 5. The reflective electrode 7 has a reflectivity of greater than or equal to 80% in the visible spectral range.

It is particularly advantageous if those organic layers of the organic functional layer stack, in particular those which have a thickness of greater than or equal to 5 nm, have an absorption coefficient k of less than or equal to 0.005 in the visible spectral range, that is to say for wavelengths of greater than 450 nm.

In addition to the layers shown in FIG. 1A, even further organic layers can be present, for example, an electron-blocking layer between the light-emitting layer and the hole-conducting layer 4.

Figure 1B:
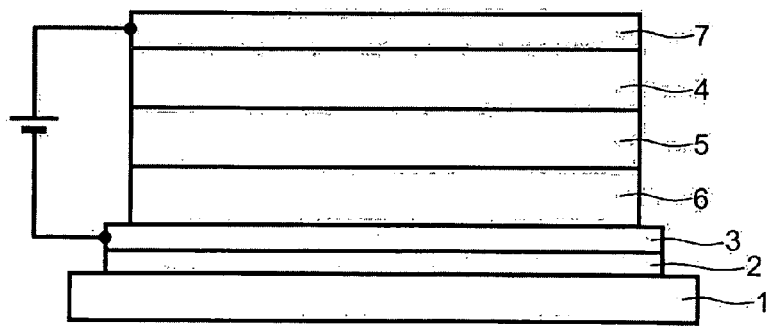
FIG. 1B shows a schematic illustration of an organic light-emitting component in accordance with a further exemplary embodiment.

FIG. 1B shows a further exemplary embodiment of an organic light-emitting component 101, in which, in comparison with the previous exemplary embodiment, the order of the organic light-emitting layer stack is reversed and which comprises on the translucent electrode 3 an electron-conducting layer 6, thereabove at least one organic light-emitting layer 5 and thereabove an organic hole-conducting layer 4, such that in this exemplary embodiment the hole-conducting layer 4 is arranged between the at least one organic light-emitting layer 5 and the reflective electrode 7.

The materials of the layers of the component 101 can be embodied as in the previous exemplary embodiment and as described in the general part. As in the exemplary embodiment in FIG. 1A, the organic light-emitting component 101 in FIG. 1B likewise has a distance of greater than or equal to 150 nm between the at least one light-emitting layer 5 and the reflective electrode.

Figure 2:
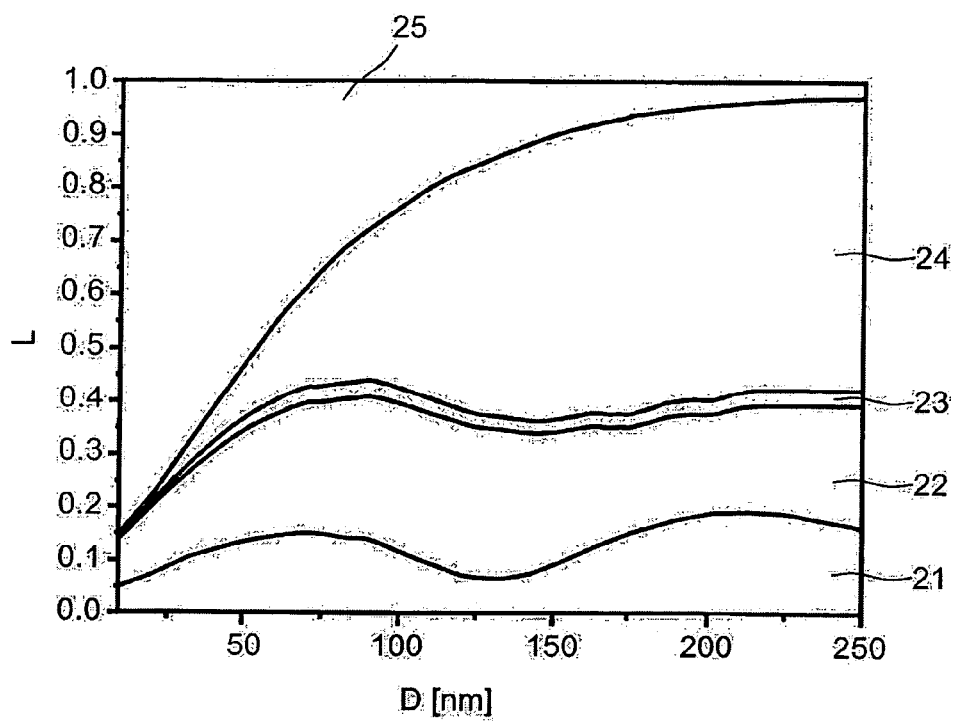
FIG. 2 shows a schematic illustration of relative proportions of coupling-out and loss channels of the radiation power generated in the active layer of a conventional OLED.

The herein described particularly large distance of greater than or equal to 150 nm between the light-emitting layer 5 and the reflective electrode 7 in the exemplary embodiments shown together with the optical coupling-out layer 2, can bring about a significant increase in efficiency in comparison with known OLEDs. This becomes apparent in particular in association with FIG. 2, which is based on a simulation of a conventional green-emitting OLED on a standard glass substrate without an optical coupling-out layer or other coupling-out measures and shows, as a function of the thickness D of the layer or layers arranged between the light-emitting layer and the reflective electrode, which corresponds to the distance between the reflective electrode and the light-emitting layer, the relative proportions L of the coupling-out and loss channels of the light generated in the light-emitting layer. In this case, the shown relative proportions of the coupling-out and loss channels should not be understood as restrictive for the exemplary embodiments described here and can vary depending on the construction and choice of material of the individual components.

The region 21 identifies that relative proportion of the light which is coupled out from the translucent substrate. The region 22 corresponds to that relative proportion of the light which is guided in the glass substrate by means of waveguiding. The region 23 identifies that relative proportion of the light which is lost as a result of absorption in the organic layers, the translucent electrode and the substrate. The region 24 identifies that relative proportion of the light which is guided in the translucent electrode and the organic layers, for example, in the case of a layer order as in FIG. 1A in particular in the hole-conducting layer, as a result of waveguiding effects. The region 25 identifies that proportion which is lost by means of surface plasmons being coupled into the reflective electrode.

It is evident that the relative proportion of the light 21 that is coupled out from the substrate rises slightly starting from a value for D of 150 nm, while the loss channel caused by plasmons being coupled in, that is to say the region 25, decreases considerably mainly as the value for D rises, as a result of which the relative proportion of the light guided in the organic layers and the translucent electrode rises. In particular, the proportion 25 of the plasmon loss channel is less than 10% for a value of D of greater than or equal to 150 nm.

As a result of the additional optical coupling-out layer 2 present in the organic light-emitting components described here, in particular that proportion of the light which is guided in the translucent electrode 3 and the organic layers and which is dominant in the case of a distance D of greater than or equal to 150 nm between the organic light-emitting layer 5 and the reflective electrode 7 can be at least partly coupled out. As a result, it is possible to achieve a significant increase in efficiency as a result of increased coupling-out of light for the organic light-emitting components described here.

Figure 3:
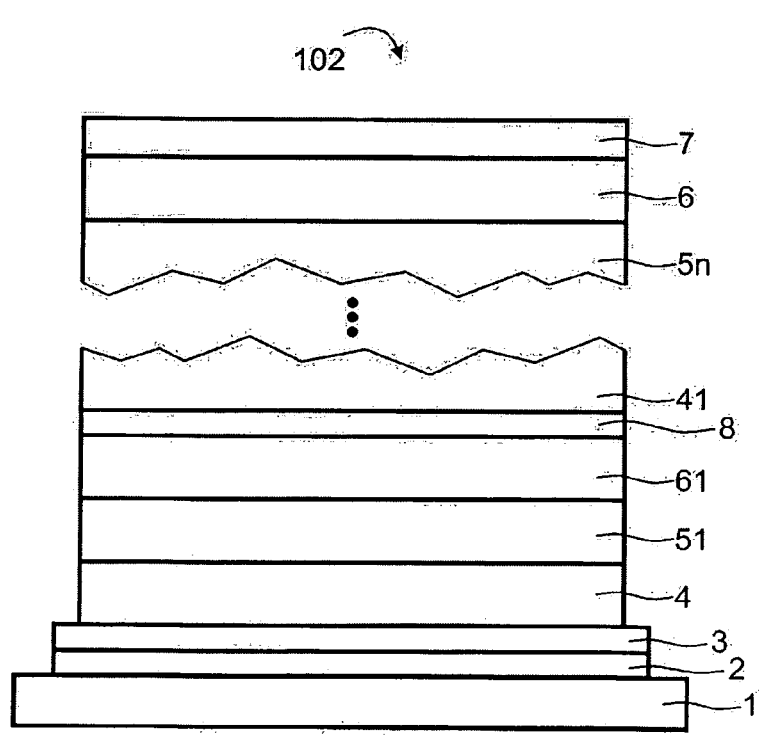
FIG. 3 shows a schematic illustration of an organic light-emitting component in accordance with a further exemplary embodiment.

FIG. 3 shows a further exemplary embodiment of an organic light-emitting component 102, which constitutes a modification of the exemplary embodiment from FIG. 1A and comprises, in comparison therewith, a plurality of light-emitting layers, of which the layers 51 and 5n are shown for illustration purposes, between which further light-emitting layers can be situated. In this case, each of the light-emitting layers 51, ..., 5n is arranged between a hole-conducting layer and an electron-conducting layer, thus for example, the light-emitting layer 51 shown in FIG. 3 between the hole-conducting layer 4 and the electron-conducting layer 61.

The organic light-emitting component 102 thus comprises functional stack units arranged in series between the translucent electrode 3 and the reflective electrode 7, wherein between mutually adjacent hole-conducting and electron-conducting layers, thus for example, the electron-conducting layer 61 discernible in FIG. 3 and the hole-conducting layer 41 adjacent thereto, there is arranged a so-called "charge generation layer" (CGL) 8, which serves as a so-called charge carrier pair generation zone, whereby the series voltage of the organic layer stack can be reduced. By way of example, a CGL comprises a p-doped layer and an n-doped layer, between which an undoped intermediate layer, for example, composed of a metal oxide, is arranged.

As in the exemplary embodiment in FIG. 1A, the topmost electron-conducting layer 6 is arranged in a manner directly adjacent to and adjoining the reflective electrode 7 and has a thickness as described in conjunction with the previous exemplary embodiments, such that the distance between the topmost light-emitting layer 5n shown in FIG. 3, said topmost light-emitting layer thus being closest to the reflective electrode 7, and the reflective electrode 7 is greater than or equal to 150 nm in order as far as possible to suppress plasmon excitation in the reflective electrode 7.

The organic layers of the exemplary embodiments shown here have a thickness of at least 250 nm for the individual functional layer stack units, such that the stacked construction in FIG. 3 can have a total thickness of up to 1 pm. Particularly preferably, the light-emitting layers 51, ..., 5n of the stacked construction of the organic light-emitting component 102 emit combinations of red, green, blue and/or white light. Particular preference is given here to a construction comprising two light-emitting layers, which emit red/green and blue or which both emit white, or else a construction comprising three light-emitting layers, which all emit white, which emit red, green and blue or which emit red/green and blue and blue.

As an alternative to the layer order of the organic layers as shown in FIG. 3, the construction of the organic layer stack of the exemplary embodiment in FIG. 3 can also be inverted as in the exemplary embodiment in FIG. 1B.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic light-emitting component comprising:
a translucent substrate;
an optical coupling-out layer overlying the translucent substrate;
a translucent electrode overlying the coupling-out layer;
an organic functional layer stack having organic functional layers, the organic functional layer stack comprising:
an organic hole-conducting layer or an organic electron-conducting layer overlying the translucent electrode,
an organic light-emitting layer overlying the hole-conducting layer or overlying the organic electron-conducting layer, and
an organic electron-conducting layer or an organic hole-conducting layer; and
a reflective electrode,
wherein the organic light-emitting layer is at a distance of greater than or equal to 150 nm from the reflective electrode, and
wherein the electron-conducting layer or the hole-conducting layer is arranged between the reflective electrode and the light-emitting layer, is thicker than 5 nm, has an absorption coefficient k of less than or equal to 0.005 for wavelengths of greater than 450 nm, and is doped.

2. The component according to claim 1, wherein the organic hole-conducting layer or the organic electron-conducting layer comprises an organic hole-conducting layer, and wherein the organic electron-conducting layer or the organic hole-conducting layer comprises an organic electron-conducting layer.

3. The component according to claim 1, wherein, at a wavelength of 600 nm, an optical length between the light-emitting layer and the reflective electrode is greater than or equal to 1.6×150 nm and less than or equal to 1.8×225 nm.

4. The component according to claim 1, wherein a distance between the light-emitting layer and the reflective electrode is greater than or equal to 180 nm and less than or equal to 225 nm.

5. The component according to claim 1, wherein a distance between the light-emitting layer and the reflective electrode is chosen such that a relative proportion of radiation power generated in the light-emitting layer is coupled into the reflective electrode in the form of plasmons, the relative proportion being less than or equal to 10%.

6. The component according to claim 1, wherein the electron-conducting layer or the hole-conducting layer, is the hole-conducting layer, which comprises a hole transport layer with a thickness of up to 350 nm.

7. The component according to claim 1, wherein the translucent electrode has an absorption coefficient k of less than or equal to 0.005 for wavelengths of greater than 450 nm and a total transmission in a visible spectral range of greater than or equal to 80%.

8. The component according to claim 1, wherein the reflective electrode has a reflectivity of greater than or equal to 80% in a visible spectral range.

9. The component according to claim 1, wherein the optical coupling-out layer has a refractive index that is greater than or equal to a layer-thickness-weighted average refractive index of the organic functional layer stack and the translucent electrode.

10. The component according to claim 1, wherein the optical coupling-out layer is light-scattering.

11. The component according to claim 1, wherein the optical coupling-out layer comprises a material having a refractive index of greater than or equal to 1.8, in which scattering centers are arranged in a distributed fashion.

12. The component according to claim 1, wherein the organic functional layer stack also comprises a further organic layer selected from:
a hole-blocking layer between the electron-conducting layer and the light-emitting layer; and
an electron-blocking layer between the hole-conducting layer and the light-emitting layer.

13. The component according to claim 1, further comprising a plurality of light-emitting layers arranged between the hole-conducting layer and the electron-conducting layer.

14. The component according to claim 1, wherein the translucent electrode has a resistivity of greater than or equal to 150 μΩ·cm and less than or equal to 500 μΩ·cm.

15. The component according to claim 1, wherein the electron-conducting layer or the hole-conducting layer is a hole transport layer, which is a part of the hole-conducting layer and has a thickness of up to 350 nm.

16. An organic light-emitting component, comprising:
a translucent substrate;
an optical coupling-out layer overlying the translucent substrate;
a translucent electrode overlying the coupling-out layer;
an organic functional layer stack having organic functional layers, comprising:
an organic hole-conducting layer or an organic electron-conducting layer overlying the translucent electrode,
the organic light-emitting layer overlying the hole-conducting layer or overlying the organic electron-conducting layer, and
an organic electron-conducting layer or an organic hole-conducting layer; and
a reflective electrode,
wherein the organic light-emitting layer is at a distance of greater than or equal to 150 nm from the reflective electrode, and
wherein the translucent electrode has an absorption coefficient k of less than or equal to 0.005 for wavelengths of greater than 450 nm and a total transmission in a visible spectral range of greater than or equal to 80%.

* * * * *